(12) United States Patent
Cardullo

(10) Patent No.: US 8,487,524 B2
(45) Date of Patent: Jul. 16, 2013

(54) UV GENERATED VISIBLE LIGHT SOURCE

(76) Inventor: Mario W. Cardullo, Alexandria, VA (US)

( * ) Notice: Subject to any disclaimer, the term of this patent is extended or adjusted under 35 U.S.C. 154(b) by 187 days.

(21) Appl. No.: 12/491,937

(22) Filed: Jun. 25, 2009

(65) Prior Publication Data

US 2009/0322201 A1    Dec. 31, 2009

Related U.S. Application Data

(60) Provisional application No. 61/075,398, filed on May 25, 2008, provisional application No. 61/079,206, filed on Jul. 9, 2008.

(51) Int. Cl.
*H01J 1/62* (2006.01)
*H01J 63/04* (2006.01)

(52) U.S. Cl.
USPC .............................. 313/498; 362/84

(58) Field of Classification Search
USPC ............ 313/483, 498, 501, 502, 503; 257/98; 362/558, 84, 293, 259
See application file for complete search history.

(56) References Cited

U.S. PATENT DOCUMENTS

| | | | |
|---|---|---|---|
| 5,135,568 A | 8/1992 | Fasano | |
| 5,585,692 A | 12/1996 | Sugimoto et al. | |
| 5,998,925 A * | 12/1999 | Shimizu et al. | 313/503 |
| 6,350,041 B1 * | 2/2002 | Tarsa et al. | 362/231 |
| 6,469,447 B2 | 10/2002 | Nakagawa et al. | |
| 6,472,765 B1 * | 10/2002 | Sano et al. | 257/787 |
| 2004/0217693 A1 * | 11/2004 | Duggal et al. | 313/504 |
| 2006/0138435 A1 | 6/2006 | Tarsa et al. | |
| 2007/0090383 A1 * | 4/2007 | Ota et al. | 257/98 |
| 2007/0131954 A1 * | 6/2007 | Murayama et al. | 257/98 |
| 2007/0278503 A1 * | 12/2007 | Van De Ven et al. | 257/88 |
| 2007/0284600 A1 * | 12/2007 | Shchekin et al. | 257/98 |
| 2008/0310158 A1 * | 12/2008 | Harbers et al. | 362/240 |
| 2008/0315228 A1 * | 12/2008 | Krames et al. | 257/98 |
| 2009/0072710 A1 | 3/2009 | Schmidt et al. | |
| 2010/0265734 A1 * | 10/2010 | Bulovic et al. | 362/558 |
| 2011/0038138 A1 * | 2/2011 | Cardullo | 362/84 |

FOREIGN PATENT DOCUMENTS

| | | |
|---|---|---|
| JP | 2001-243821 | 9/2001 |
| JP | 2006-059625 | 3/2006 |
| WO | 2008-134056 | 11/2008 |

OTHER PUBLICATIONS

Notification of Transmittal of International Search Report and Written Opinion of the International Searching Authority, or the Declaration, International Search Report and Written Opinion of the International Searching Authority, from PCT Application PCT/US2009/048645, all mailed Feb. 25, 2010.
Notification of Transmittal of International Search Report and Written Opinion of the International Searching Authority, or the Declaration and Written Opinion of the International Searching Authority from PCT Application PCT/US2009/054041, all mailed May 14, 2010.

* cited by examiner

*Primary Examiner* — Mariceli Santiago
*Assistant Examiner* — Glenn Zimmerman
(74) *Attorney, Agent, or Firm* — Todd L. Juneau

(57) ABSTRACT

A device and method for an ultraviolet light (UV) light based visible light generator is disclosed. The UV light source emits a beam of UV light that may be scattered onto surfaces including UV light reactive materials that produces visible light when excited by the scattered UV light. The UV light may be coherent or non-coherent light.

15 Claims, 4 Drawing Sheets

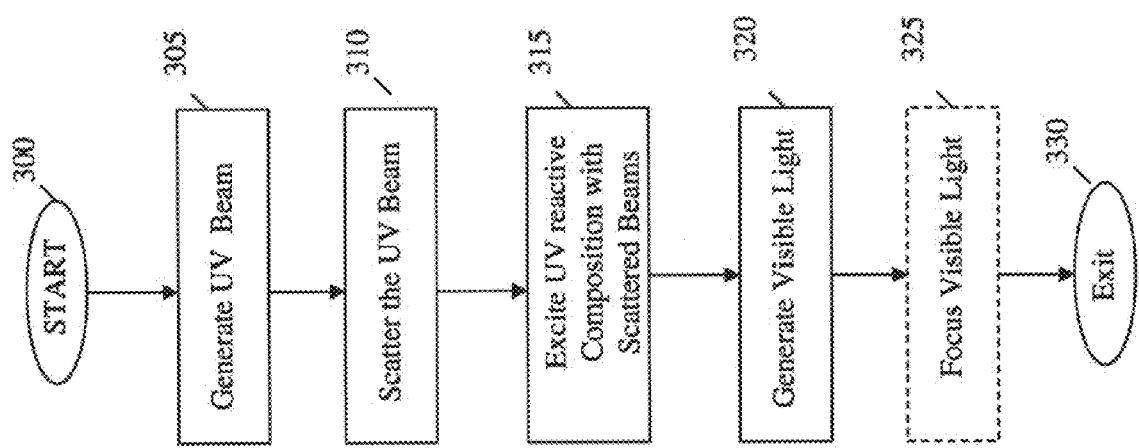

UV GENERATED VISIBLE LIGHT SOURCE

CROSS-REFERENCE TO RELATED APPLICATIONS

This application claims benefit and priority to U.S. Provisional Application No. 61/075,398 filed Jun. 25, 2008 entitled UV-LASER GENERATED VISIBLE LIGHT SOURCE, and also to U.S. Provisional Application No. 61/079,206 filed Jul. 9, 2008 entitled UV-LASER GENERATED VISIBLE LIGHT SOURCE, the disclosures of which are incorporated by reference herein in their entirety.

BACKGROUND OF THE INVENTION

1. Field of the Invention

The invention is directed to an apparatus and method for generating visible light and, more particularly, to an apparatus and method for generating visible light using an ultraviolet laser, or similar UV light source.

2. Related Art

Light generating sources today, such as flashlights or general light bulbs, for example, use traditional techniques for generating light that might involve an incandescent bulb or in newer versions, compact fluorescents, light emitting diodes (LEDs) and the like. These approaches have several limitations. For example, the power requirement may be relatively high and the bulbs or diodes may have a relatively short life expectation due to being damaged in normal use, or by burnout. Furthermore, some may have complicated structures and use dangerous chemicals such as compact fluorescents. Moreover, the amount of lumens produced may be relatively limited.

By far the most common application of fluorescence in daily life is in the fluorescent light bulb, of which there are more than 1.5 billion operating in the United States. Fluorescent light stands in contrast to incandescent, or heat-producing, electrical light. First developed successfully by Thomas Edison (1847-1931) in 1879, the incandescent lamp quite literally transformed human life, making possible a degree of activity after dark that would have been impractical in the age of gas lamps. Yet, incandescent lighting is highly inefficient compared to fluorescent light: in an incandescent bulb, fully 90% of the energy output is wasted on heat, which comes through the infrared region.

A fluorescent bulb consuming the same amount of power as an incandescent bulb will produce about three to five times more light, and it does this by using a phosphor, a chemical that glows when exposed to electromagnetic energy. (The term "phosphor" should not be confused with phosphorescence: phosphors are used in both fluorescent and phosphorescent applications.) The phosphor, which typically coats the inside surface of a fluorescent lamp, absorbs ultraviolet light emitted by excited mercury atoms. It then re-emits the ultraviolet light, but at longer wave-lengths, as visible light. Thanks to the phosphor, a fluorescent lamp gives off much more light than an incandescent one, and does so without producing much heat.

Accordingly, alternative techniques for efficiently producing reliable, safe and bright visible light cost effectively would be a welcomed advancement in the light producing industry.

SUMMARY OF THE INVENTION

The invention meets the foregoing need and includes a method and apparatus to cost effectively and reliably produce visible light from a UV light source. In one aspect, the invention includes producing visible light by generally directing UV light onto a UV light reactive surface to produce visible light. This surface may comprise a reflective surface.

Accordingly, in another aspect of the invention, an apparatus for generating visible light is disclosed. The apparatus includes an ultraviolet (UV) light source configured to emit UV light, a UV light scattering mechanism to scatter the UV light, and a UV light reactive composition that reacts to the scattered UV light produce visible light.

According to still another aspect of the invention, a method for producing visible light from ultraviolet (UV) light is provided. The method including emitting a beam of UV light from a UV light source, and scattering the beam onto a UV light reactive composition to produce visible light.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings:

FIG. 3 is a flow diagram showing an exemplary process performed according to principles of the invention.

DETAILED DESCRIPTION OF THE INVENTION

Figure 1A:
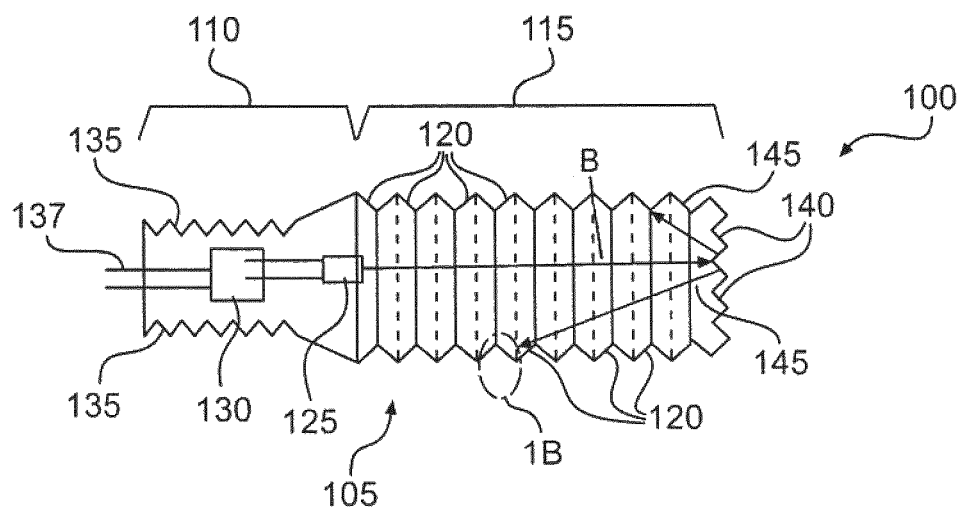
FIG. 1A is an illustration of an embodiment for a visible light generating device, constructed according to principles of the invention.

It is understood that the invention is not limited to the particular methodology, protocols, etc., described herein, as these may vary as the skilled artisan will recognize. It is also to be understood that the terminology used herein is used for the purpose of describing particular embodiments only, and is not intended to limit the scope of the invention. It is also to be noted that as used herein and in the appended claims, the singular forms "a," "an," and "the" include the plural reference unless the context clearly dictates otherwise. Thus, for example, a reference to "an address" is a reference to one or more addresses and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings. As used herein, visible light is generally defined as light discernable to a human eye. However, the invention may have other applications which generally are apparent from the disclosure.

FIG. 1A is an illustration of an embodiment for a visible light generating device, constructed according to principles of the invention, general denoted by reference numeral 100. The visible light generating device 100 includes a body 105 having a first portion 110 and a second portion 115, the second portion 115 may be configured in a generally cylinder shape. An ultraviolet (UV) laser 125 may be used as an initial source of UV light and may be configured to emit a beam "B" of lased UV light in the UV light spectrum range along the extent of the second portion 115. The UV laser 125 may be a low cost blue diode version and/or a blue laser that produces a beam having a wavelength between about 360 and about 480 nm, for example. The UV laser 125 is an example of a coherent light source. The UV laser 125 may be permanently or removably coupled to the first portion 110, or alternatively, permanently or removably coupled to the second portion 115, as long as the UV laser is configured to emit a beam "B" generally along the horizontal axis (given the orientation as shown in FIG. 1A) of the second portion, and aligned to project the beam onto a scattering mechanism, such as scattering surface 140.

The first portion 110 may be configured with connecting mechanisms 135, which are shown in FIG. 1A as threads, to attach the visible light generating device 100 to a fixture such as a standard household light socket, flashlight, or other permanent or mobile light fixture. Other types of connecting mechanisms may be employed depending on the application, such as a flange mount, for example. Electrical connectivity may connect the UV laser 125 to any control electronics 130, as necessary, or connect 137 to a power source (not shown) such as a battery, AC power or the like. The control electronics 130 and the UV laser 125 may be a unified component in some embodiments.

The second portion 115 may be configured generally in a cylindrical shape with a plurality or series of circumferential grooves 120 around the outer circumference of the second portion 115. In a preferred embodiment, the second portion 115 may constructed as a barrel shaped solid plastic structure suitable for passing UV light and/or visible light, or may be constructed from or include other UV light and/or visible light passing material. The grooves 120 may be layered (or alternatively, impregnated) on at least one surface with a UV light reactive composition that emits visible light when excited by a UV laser. Such UV light reactive composition may include phosphorous or a phosphorous composition, aluminum or an aluminum composition, compositions that include these elements, or similar compounds such that under exposure to UV laser light produces visible light, and/or other reflective compositions.

These UV fluorescent material, or luminescent material that react to UV light, may be obtained from several sources; one example is MiniScience Corporation of Clifton, N.J. The luminescent material may also be obtained via an on-line website at the ChemicalStore<dot>com, where their collection of luminescent materials products is currently known as their Luminescent Materials Collection.

Figure 2:
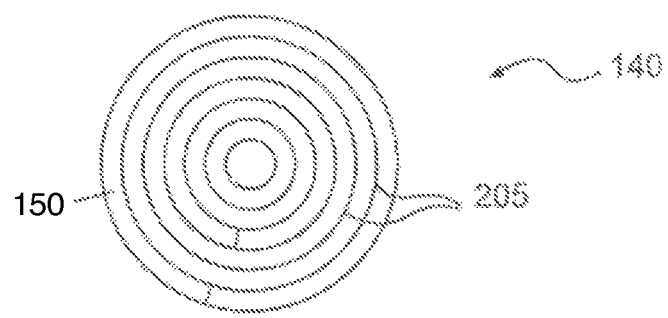
FIG. 2 is an end on view of the visible light generating device of FIG. 1A, viewed from the scattering surface end.

The second portion 115 may also include a UV light scattering surface 140. The UV light scattering surface may be configured to reflect and scatter a UV laser beam "B" backward into the "barrel" of the second portion 115. FIG. 2 is an end on view of the light generating device viewed from the scattering surface end. The inner surface of the scattering surface 140 may include a series of circular grooves 205, similar to the circumferential grooves 120 along the length of the barrel in the second portion 115, but the circular grooves 205 may be formed in a plane oriented substantially perpendicular to the beam "B." The circular scattering grooves 140 may have angles and characteristics that scatter a UV beam backward into the barrel of the second portion 115. The angled surfaces of the circular scattering grooves 140 may be layered or impregnated with a UV light reflecting material to reflect and scatter the beam "B," in suitable angles to strike along the barrel of the second portion 115, as shown by reflected beams 145. In other embodiments, other geometric patterns may be employed other than the circular pattern for the grooves as shown in FIG. 2.

Figure 1B:
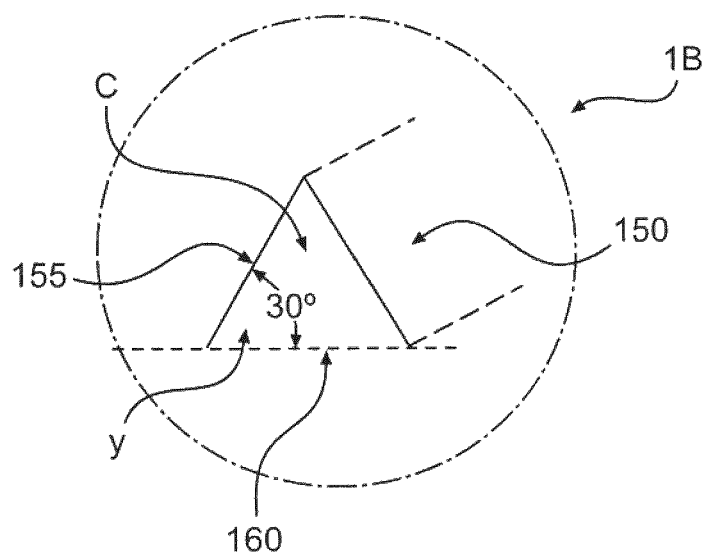
FIG. 1B is an exploded view of the area denoted by "1B" of FIG. 1A.

FIG. 1B is an exploded view of the area denoted by "1B" of FIG. 1A. The exploded view "1B." illustrates the general configuration of a groove 120 with a front face 150 and a back face 155 forming a groove. The area denoted "C" is an open area of a groove formed between the front face 150 and the back face 155. The angle "y" formed between the front face 155 and the reference line 160 (the reference line 160 is aligned along the outermost peaks of the grooves 120 along the extent of the second portion 115) forms an angle of about 30 degrees, but may vary. The front face 150 may be layered or impregnated with the UV light reactive composition that emits visible light when excited by a UV laser, as described previously.

Figure 1C:
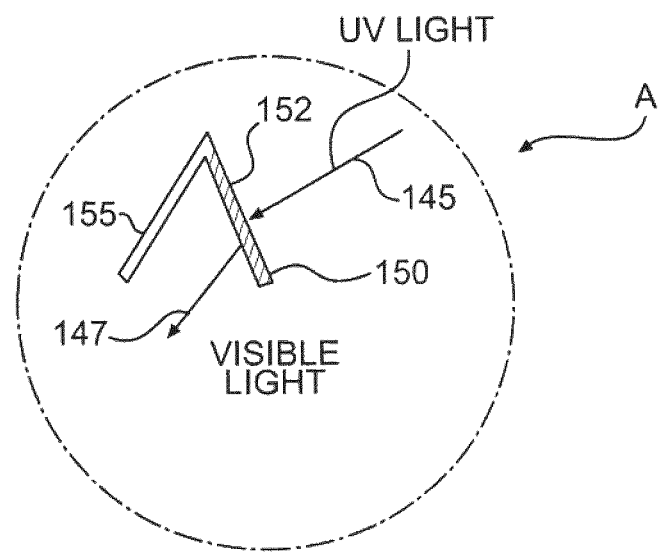
FIG. 1C is another illustration of the exploded view of the area denoted as "1B" of FIG. 1A, showing the functional characteristics of a reflected lased UV beam on a UV light reactive composition surface, according to principles of the invention.

FIG. 1C is another illustration of the exploded view of the area denoted as "1B" of FIG. 1A, showing the functional characteristics of a reflected lased UV beam on a UV light reactive composition surface, according to principles of the invention. FIG. 1C shows a front face 150 and a back face 155 (there are a plurality of front faces and a plurality of back faces formed along the second portion 115) with a reflected beam of lased UV light 145 striking the front face 150. Front face 150 comprises a UV light reactive composition 152 surface (such as an aluminum and/or phosphorus material, reflective compositions, or the like) which may be a film, coating, layered application, or impregnation of one or more of the groove forming surface 150. As a result, the electrons of the UV light reactive composition surface are sufficiently excited to cause emission of visible light from the front face 150, principally exiting from the front face 150 as visible light 147. In particular, when the reflected UV beam strikes any of the front faces, the UV beam excites the electrons of the phosphorus/aluminum layer to a higher state and subsequently emits a photon when returning to a lower state. In some applications, the UV light reactive composition 152 may be of exceedingly thin thickness, perhaps to the atomic or molecular level. Emitted visible light may emit in any direction relative to the UV light reactive composition.

Since there is a plurality of scattering grooves 140, the UV laser beam "B" may be reflected and scattered generally uniformly back into the barrel of the second portion 115 so that UV lased light strikes a great multitude of locations on the plurality of front faces 150 on the plurality of grooves 120 around the entire circumference of the second portion 115. As a result, a relatively intense flood of visible light 147 about the visible light generating device 100 may be produced suitable for harnessing and use in many applications that might require a visible light source, such as flashlights, room lights, car lights, street lights, electronic devices, and so forth.

The visible light generating device 100 may be formed as one solid piece of translucent or transparent (to UV) plastic or other suitable material, thus creating a very environmentally resistant device, such as being nearly impervious to moisture. The UV laser 125 may be fabricated as a quite rugged component resistant to tough physical demand including shock, vibration, temperature extremes, pressure changes, and the like. The power demand may also be quite low. The amount of visible light output may be related to the power of the UV laser employed and the efficiency of the UV light reactive composition, but a very high visible light output may be achieved with a suitably chosen combination.

In another aspect, portions of the scattering surface 140 also may be layered or impregnated with the UV light reactive composition, as described above, to emit visible light. In this dual mode embodiment, the scattering surface 140 acts both to reflect and scatter UV light back into the barrel of the second portion 115 and may also act to emit visible light, itself.

The second portion 115 barrel shape may be made from transparent or translucent plastic or similar UV light passing material. The barrel end (such as scattering surface 140) may be made of the same type of plastic or similar light passing material, and also has grooves in a circular pattern on the surface. Preferably, the first portion 110 may be made of the same material as the second portion 115, but the first portion 110 may be made from different materials, if an application warrants this difference.

Figure 1D:
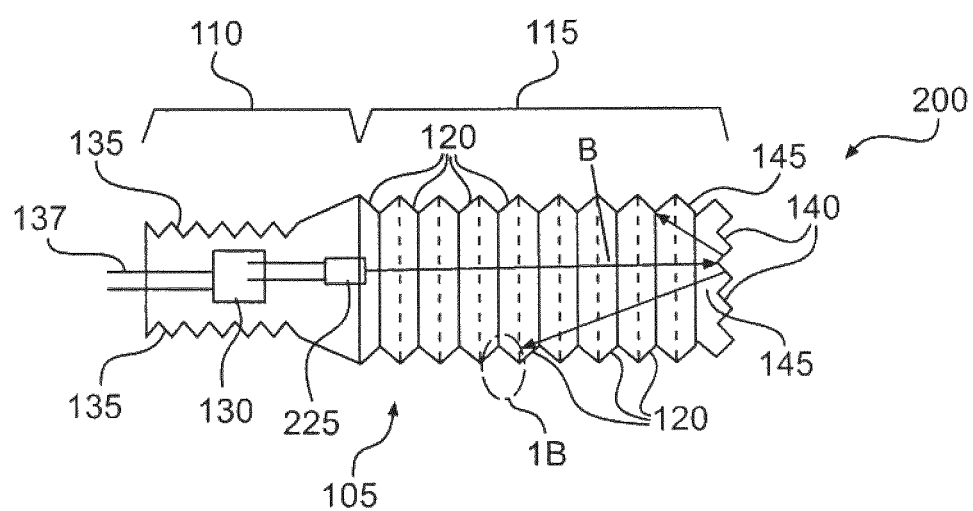
FIG. 1D is an illustration of another embodiment for a visible light generating device, constructed according to principles of the invention.

FIG. 1D is an illustration of another embodiment for a visible light generating device, constructed according to principles of the invention, generally designated as reference numeral 200. The visible light generating device 200 of FIG. 1D is similar to the visible light generating device of FIG. 1A except that the UV light source is a UV light emitting diode (LED) 225. The UV light emitting diode (LED) 225 is an example of a non-coherent light source.

Figure 1E:
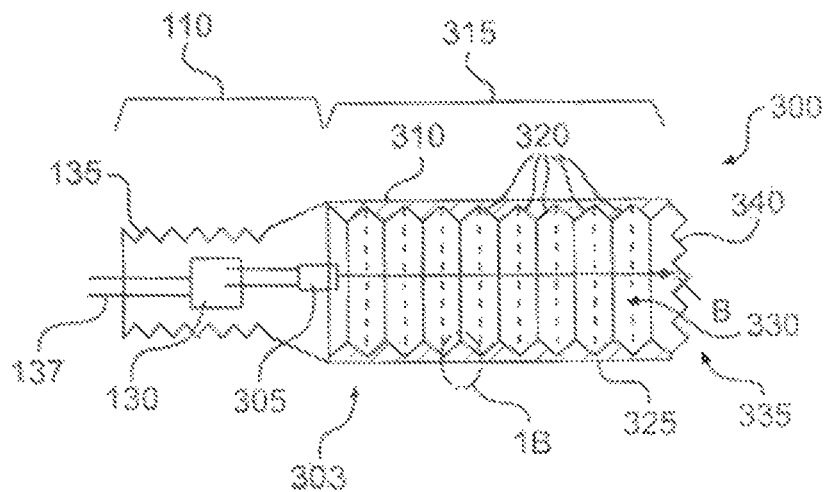
FIG. 1E is an illustration of another embodiment for a visible light generating device, constructed according to principles of the invention.

FIG. 1E is an illustration of another embodiment of a visible light generating device, constructed according to principles of the invention, generally denoted by reference numeral 300. The embodiment of FIG. 1E may be similar to the embodiment of FIG. 1A, but with some differences. The visible light generating device 300 includes a body 303 having a first portion 110 and a second portion 315, the second portion 315 may be configured in a generally cylinder shape, having an outer surface 310. The outer surface 310 may be a surface that forms the outermost surface of the second portion 315, having a circumference generally around the cylinder of the second portion. An end portion 335 may be removably attached, such as by threads, or permanently attached to the second portion 315. The end portion 335 may be constructed with a scattering mechanism such as scattering grooves 340 formed on at least one of its surfaces, in a manner similar to FIG. 2.

Still referring to FIG. 1E, the second portion 315 may be constructed with a hollow interior 330, which may be constructed with a UV light scattering mechanism, such as scattering grooves 320, arranged along the inner surface if the second portion 315. In one aspect, the end portion 315 may be removable to permit access to the hollow interior 330, such as for application of the UV light reactive composition to the inner surface, i.e., on the scattering mechanism such as one or more scattering grooves 320 of the hollow interior 330 during manufacturing, for example, if the UV light reactive composition being employed requires interior surface application.

A UV light source 305, such as a UV laser or UV LED, which may be used as an initial source of light and may be configured to emit a beam "B" of UV light in the UV light spectrum range along the extent of the second portion 315. The UV light source 305 may be a low cost blue diode version and/or a blue laser that produces a beam having a wavelength between about 360 and about 480 nm, for example. A UV laser may be an example of a coherent light source. The UV light source 305 may be permanently or removably coupled to the first portion 110, or alternatively, permanently or removably coupled to the second portion 315, as long as the UV light source 305 is configured to emit a beam "B" generally along a horizontal axis (given the orientation as shown in FIG. 1E) of the second portion 315, and aligned to project the beam "B" onto a UV light scattering mechanism, such as scattering mechanism 340. The beam "B" may also contact the scattering grooves 320, at least in part, depending in part on the characteristics of the UV light source 305 employed.

The second portion 315 may constructed as a barrel shaped solid plastic structure suitable for passing UV light and/or visible light, or may be constructed from or include other suitable light passing material. The scattering grooves 320 within the hollow interior 330 (as well as scattering mechanism 340) may be layered, deposited, or alternatively, impregnated on at least one angled surface of one or more scattering grooves 320 with a UV light reactive composition that emits visible light when excited by a UV light source, as described previously. Alternatively, the UV light reactive composition may be applied as a film. The UV light scattering mechanism 340 may be configured to reflect and scatter a UV laser beam "B" backward into the "barrel" of the second portion 315. The scattering mechanism 340 may include a series of circular grooves, similar to grooves 205 (FIG. 2), either on an inner or an outer surface of end portion 335. The circular scattering mechanism 340 grooves 140 may have angles and characteristics that scatter a UV beam backward into the hollow interior 330 of the second portion 315. The visible light producing principles of the scattering mechanisms such as scattering grooves 320 has been described previously in relation to FIG. 1B. The reference to FIG. 1B in FIG. 1E is in reference to the principles taught in FIG. 1B, since the orientation of the grooves in FIG. 1B may be somewhat different when used as part of FIG. 1E.

The light source 125 or 315 may be either a coherent UV light source or a non-coherent UV light source. A UV laser may be an example of a coherent UV light source. A UV diode or UV LED may be an example of a non-coherent light source.

FIG. 3 is a flow diagram showing an exemplary process performed according to principles of the invention, starting at step 300. At step 305, a UV beam may be produced, perhaps using a low powered blue laser or UV LED, for example. The light may be coherent or incoherent. At step 310, the UV beam may be scattered and directed towards UV light reactive surfaces or compositions (such as described in relation to FIG. 1A, for example). (In some applications, the scattering might not be needed, or at least be limited; rather, the beam may be directed directly towards the reactive surface). At step 315, the UV light reactive surfaces or compositions may be excited by the UV beam. At step 320, the excited UV light reactive surfaces or compositions may emit visible light. At optional step 325, the visible light may be focused as necessary for a given application. At step 330, the process exits/stops.

The process of FIG. 3 may used in conjunction with a commercial product such as a flashlight, lamp, ceiling light, decorative light, electronic display, or the like. The process and associated device provides considerable visible light with use of minimal power. The amount of visible light may be related to the size/power of the UV light source and/or related to the amount of UV light reactive composition utilized for excitation by the UV light source. The principles herein include providing for a light source at a first wave length (e.g., UV wavelength) to be converted to light at a second wavelength (e.g., visible light wavelength). Moreover, in some applications, the UV fluorescent material may include phosphorus and at least one alkaline earth metal selected from among magnesium, strontium, calcium and barium to proved different colors of visible light.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. An apparatus for generating visible light, comprising:
   a structural body formed as one solid piece of translucent or transparent material configured in a generally cylindrical shape;
   said structural body having an outer surface coated in part with a UV light reactive composition, said coated outer surface defining a front face for emission of visible light, and
   said structural body having an inner scattering surface coated in part with a UV light reflecting material, said coated inner surface defining a back face for reflecting UV light back into the structural body, and,
   a semiconductor ultraviolet (UV) light source connected to said structural body and configured to emit UV light into an uncoated end portion of the cylindrical structural body along a horizontal axis of the structural body and aligned to project the UV light onto the inner scattering surface.

2. The apparatus of claim 1, wherein the light reactive composition contains materials other than mercury.

3. The apparatus of claim 1, wherein the structural body has a UV light reflecting material along the entire length of the inner scattering surface.

4. The apparatus of claim 1, wherein the structural body is configured as an elliptical cylinder.

5. The apparatus of claim 1, wherein the structural body is configured as a hollow cylinder.

6. The apparatus of claim 1, further comprising wherein the inner scattering surface is configured as a plurality of angled surfaces.

7. The apparatus of claim 1, wherein the UV light reactive composition is layered onto the outer surface of the structural body.

8. The apparatus of claim 1, wherein the UV light reactive composition is impregnated into the outer surface of the structural body.

9. The apparatus of claim 1, further comprising a power source to power the UV light source.

10. The apparatus of claim 1, further comprising a focusing mechanism to focus the emitted visible light.

11. The apparatus of claim 1, wherein the UV light is a blue laser.

12. The apparatus of claim 1, wherein the emitted beam of UV light has a wavelength between about 360 and about 480 nm.

13. The apparatus of claim 1, wherein the UV light source is a UV light emitting diode (LED).

14. The apparatus of claim 1, wherein the UV light source is a coherent UV light source.

15. The apparatus of claim 1, wherein the UV light source is a non-coherent UV light source.

* * * * *